(12) United States Patent
Doyle et al.

(10) Patent No.: US 7,767,519 B2
(45) Date of Patent: Aug. 3, 2010

(54) ONE TRANSISTOR/ONE CAPACITOR DYNAMIC RANDOM ACCESS MEMORY (1T/1C DRAM) CELL

(75) Inventors: Brian S. Doyle, Portland, OR (US); Dinesh Somasekhar, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 263 days.

(21) Appl. No.: 12/006,061

(22) Filed: Dec. 28, 2007

(65) Prior Publication Data

US 2009/0166701 A1 Jul. 2, 2009

(51) Int. Cl.
*H01L 21/8242* (2006.01)
(52) U.S. Cl. .................. 438/243; 438/244; 438/396
(58) Field of Classification Search ............. 438/243, 438/244, 396
See application file for complete search history.

(56) References Cited

U.S. PATENT DOCUMENTS

| 6,319,789 B1 * | 11/2001 | Carstensen | 438/396 |
| 6,369,432 B1 * | 4/2002 | Jost et al. | 257/396 |
| 2004/0235243 A1 * | 11/2004 | Noble et al. | 438/243 |

* cited by examiner

*Primary Examiner*—Charles D Garber
*Assistant Examiner*—Bryan R Junge
(74) *Attorney, Agent, or Firm*—Ryder, Lu, Mazzeo and Konieczny, LLC; Douglas J. Ryder (57) ABSTRACT

In general, in one aspect, a method includes forming a semiconductor fin. A first insulating layer is formed adjacent to the semiconductor fin. A second insulating layer is formed over the first insulating layer and the semiconductor fin. A first trench is formed in the second insulating layer and the first insulating layer therebelow. The first trench is filed with a polymer. A third insulating layer is formed over the polymer. A second trench is formed in the third insulating layer, wherein the second trench is above the first trench and extends laterally therefrom. The polymer is removed from the first trench. A capacitor is formed within the first and the second trenches.

12 Claims, 10 Drawing Sheets

ONE TRANSISTOR/ONE CAPACITOR DYNAMIC RANDOM ACCESS MEMORY (1T/1C DRAM) CELL

BACKGROUND

Today's computer chips are increasingly dependent on robust memory architecture capable of quickly accessing and handling large amounts of data. Existing memory solutions such as off-chip physical dynamic random access memory (DRAM) that sit on the mother board separate from the computer chip require relatively large amounts of energy and suffer from high latency, resulting in power-performance loss. DRAM cells that have a transistor and a capacitor that are embedded on the computer chip (1T-1C DRAM) have been used to address the latency problems. However, existing versions of 1T-1C DRAM cells are frequently unable to meet ever-increasing capacitance demands.

BRIEF DESCRIPTION OF THE DRAWINGS

The features and advantages of the various embodiments will become apparent from the following detailed description in which.

DETAILED DESCRIPTION

Figure 1:
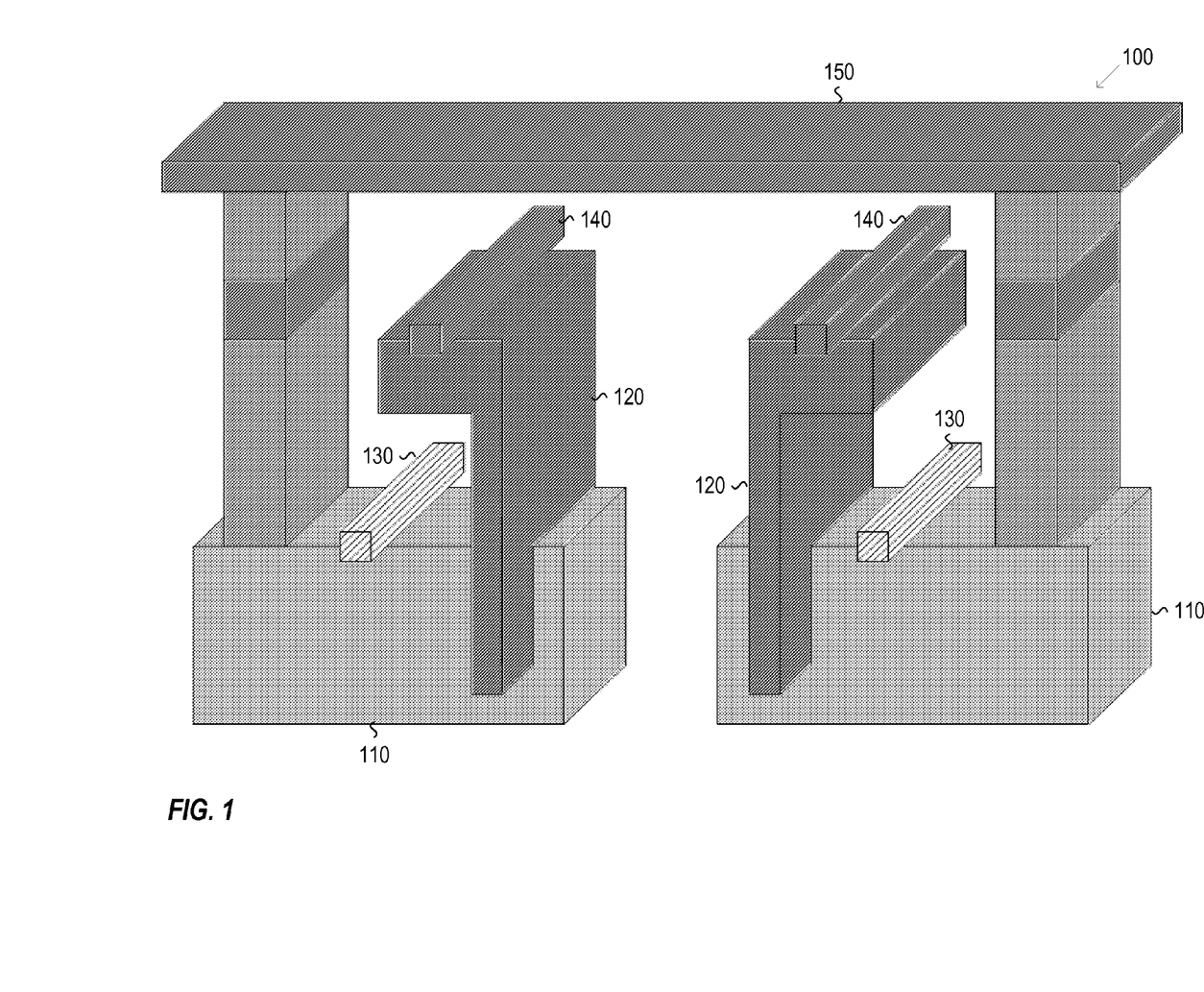
FIG. 1 illustrates a perspective view of an example 1T-1C DRAM cell, according to one embodiment.

FIG. 1 illustrates a perspective view of an example one transistor one capacitor dynamic random access memory (1T-1C DRAM) cell 100. The DRAM cell 100 includes two semiconductors layers 110, two fin capacitors 120, two word-lines 130, two plate connections 140, and a bit-line 150. The two word-lines 130 and the two semiconductor layers 110 forming two access transistors. The fin capacitors 120 may be formed on the semiconductor layer 110 but may also extend down the front and back (not visible) of the semiconductor layers 110. The fin capacitors 120 may protrude up from the semiconductor layer 110 until the capacitors are above the word-lines 130 at which point they can extend laterally over the word-lines 130. The lateral extension of the capacitors 120 provides additional capacitance by utilizing what may otherwise be vacant space (e.g., interlayer dielectric material (ILD)).

The semiconductor layers 110 may be a material selected from a group including silicon (Si), germanium (Ge), silicon germanium (SiGe), gallium arsenide (GaAs), or a combination thereof. The capacitors 120 may include a thin electrically conducting layer, a thin electrically insulating layer, and a thick electrically conducting layer (the individual layers are not illustrated). The electrically conducting layers may be metal layers selected from a range of metals and the electrically insulating layer may be a silicon dioxide, silicon nitride, or any of a range of dielectrics (e.g., $HfO_2$, $ZrO_2$) having a high dielectric constant (high K). The word-lines 130 may be formed of polysilicon or metal, the plate connections 140 may be formed of a metal, and the bit-line 150 may be formed of a metal. The transistors may be planar or 3-D (e.g., Fin, Tri-Gate).

Figure 2:
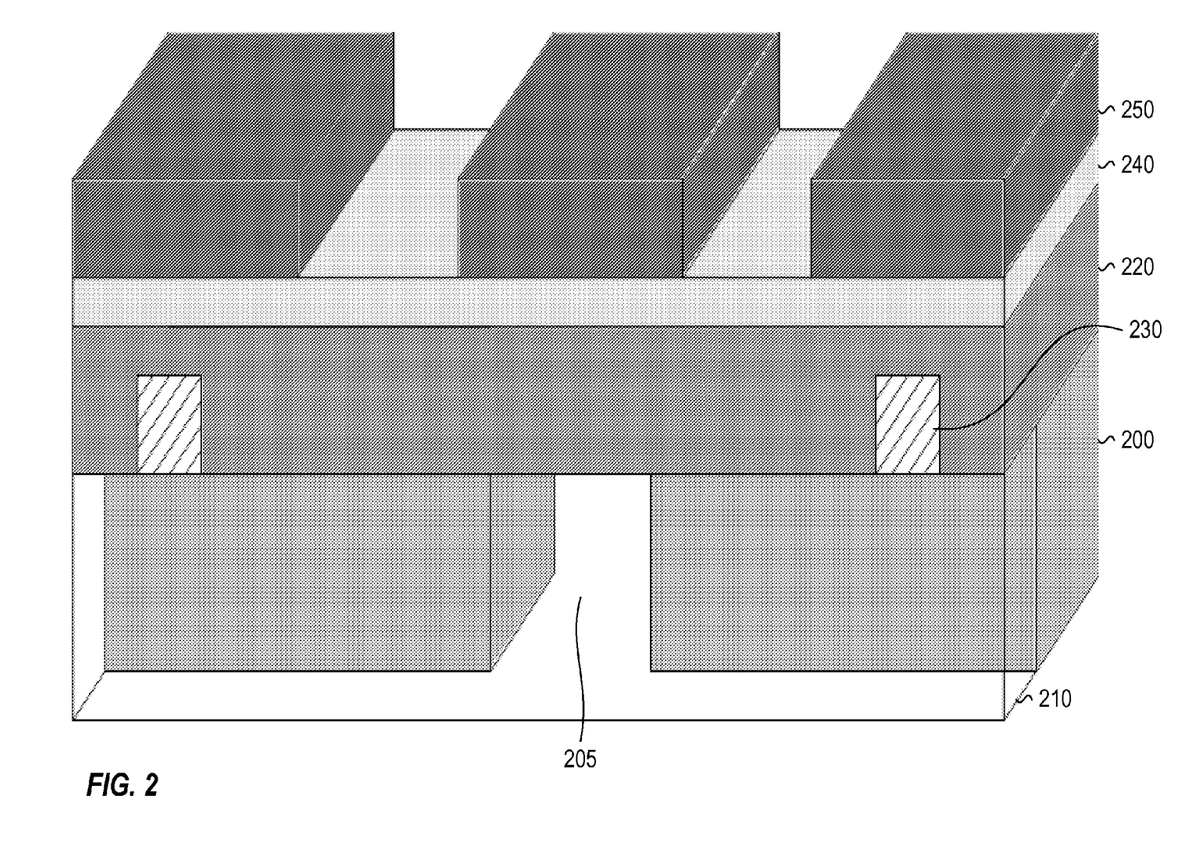
FIG. 2 illustrates an example substrate that has been processed up to contact formation, according to one embodiment.

FIGS. 2-10 illustrate an example process for forming the 1T-1C DRAM cell of FIG. 1. FIG. 2 illustrates an example substrate that has been processed up to contact formation through any number of known processes that are not described herein. The substrate includes two semiconductor fins 200 separated by a shallow trench 205. A first electrically insulating layer 210 (e.g., ILD) may be contained in the shallow trench to provide shallow trench isolation (STI) as well as in front of and behind (not visible) the semiconductor fins 200 (adjacent to the semiconductor fins 200). Word-lines 230 (e.g., polysilicon) may be formed on the semiconductor fins 200. A second electrically insulating layer 220 (e.g., ILD) may be formed on top of the semiconductor fins 200, the first electrically insulating layer 210, and the word-lines 230. A first nitride layer 240 is formed on the second electrically insulating layer 220. A first resist layer 250 is patterned over the first nitride layer 240. The first resist layer 250 is patterned so as to protect the word-lines 230 and the trench 205 when etching is performed.

Figure 3:
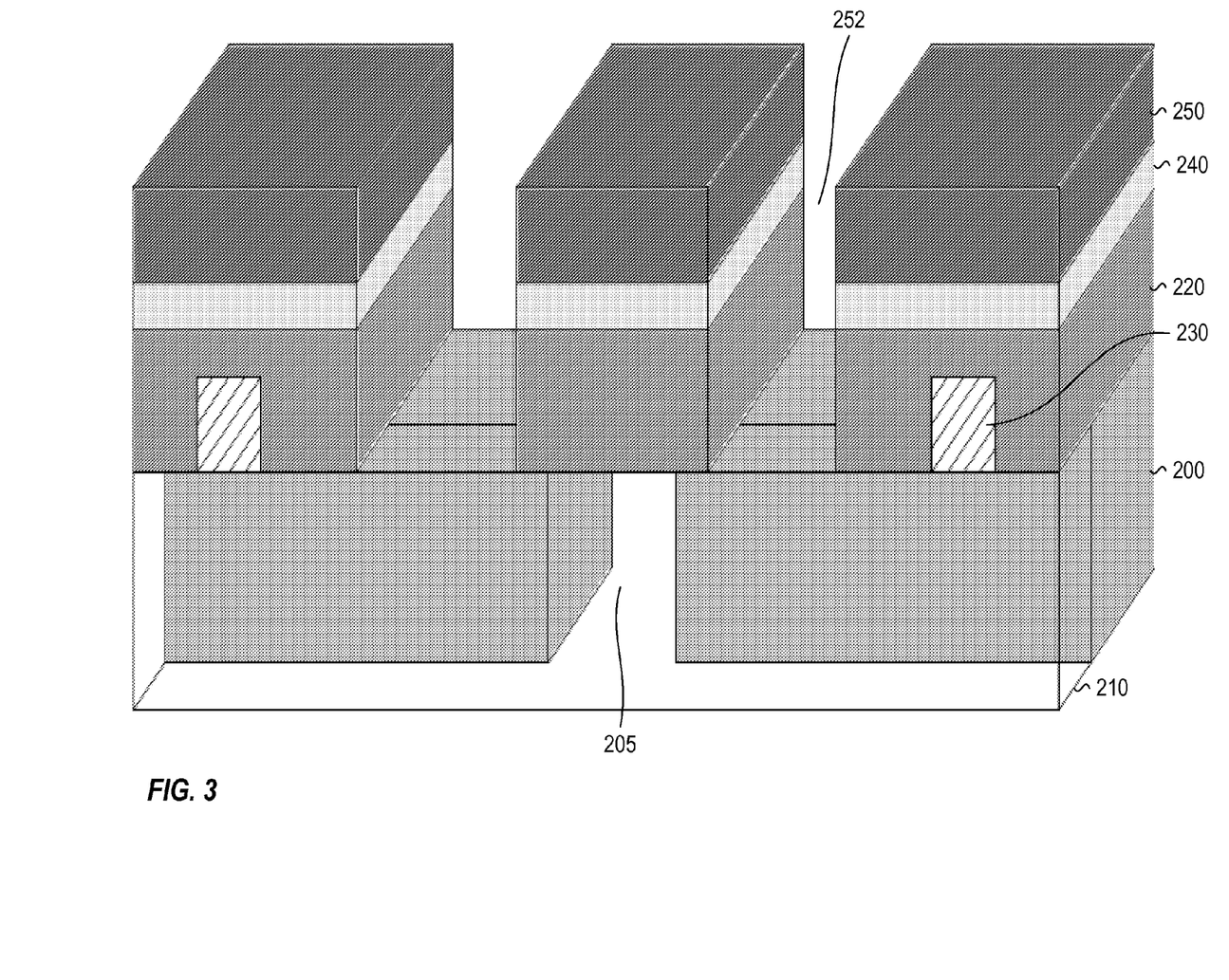
FIG. 3 illustrates the example substrate after etching of the nitride layer and the second electrically insulating layer, according to one embodiment.

FIG. 3 illustrates the example substrate after the first nitride layer 240 and the second electrically insulating layer 220 are etched down to the semiconductor fins 200 forming capacitor body trenches 252. The etching is performed using any number of known techniques.

Figure 4:
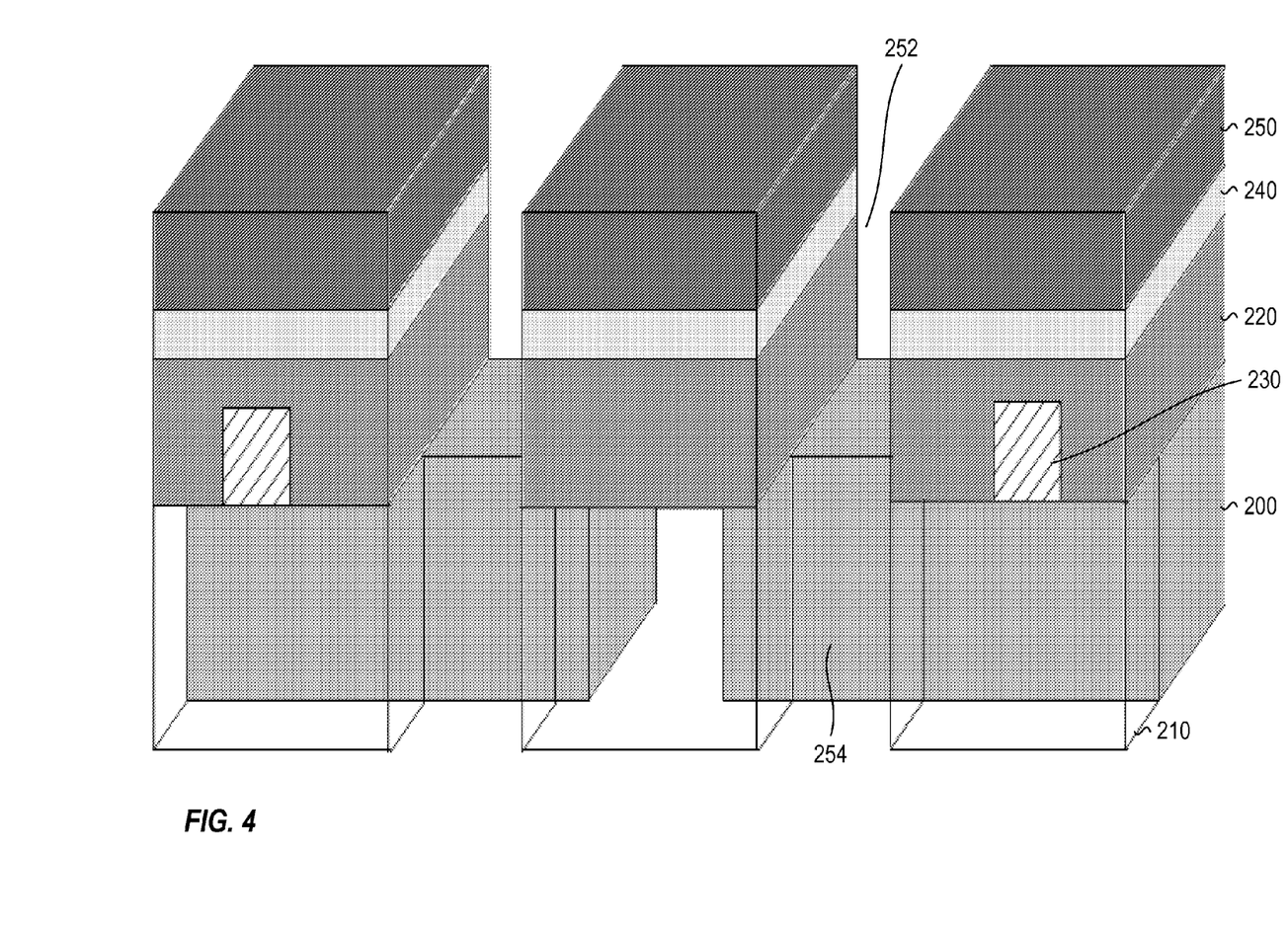
FIG. 4 illustrates the example substrate after the etching continues through the first electrically insulating layer, according to one embodiment.

FIG. 4 illustrates the example substrate after the etching continues through the first electrically insulating layer 210 located in front of and behind (not visible) the semiconductor fins 200 to create capacitor fin trenches 254. As illustrated, the capacitor fin trench 254 extended to the bottom of the semiconductor fins 200 but is not limited thereto. Rather, the depth of the capacitor fin trench 254 can vary based on amount of capacitance required. In order to control how far the etch proceeds down the fin 200, the first electrically insulating layer 210 may be two electrically insulating layers with different etch selectivities. The lower layer having a higher etch selectivity enables the etch to stop at this layer.

Figure 5:
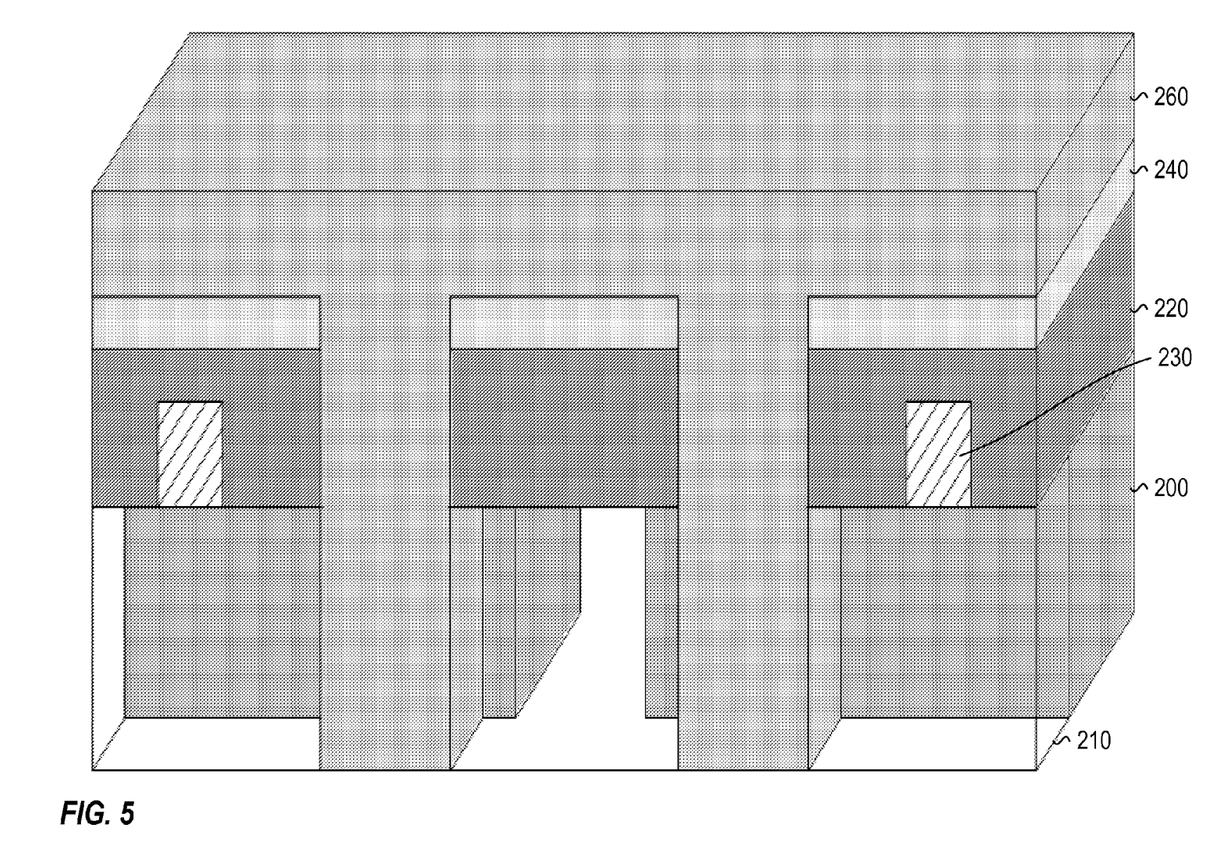
FIG. 5 illustrates the example substrate after the first resist layer is removed and the trenches are filled with a polymer, according to one embodiment.

FIG. 5 illustrates the example substrate after the first resist layer 250 is removed and the capacitor body trenches 252 and the capacitor fin trenches 254 are filled with a polymer (e.g. HMDS) 260. The polymer 260 may coat the entire surface of the substrate. The first resist layer 250 may be removed and the polymer 260 may be deposited using any number of known techniques.

Figure 6:
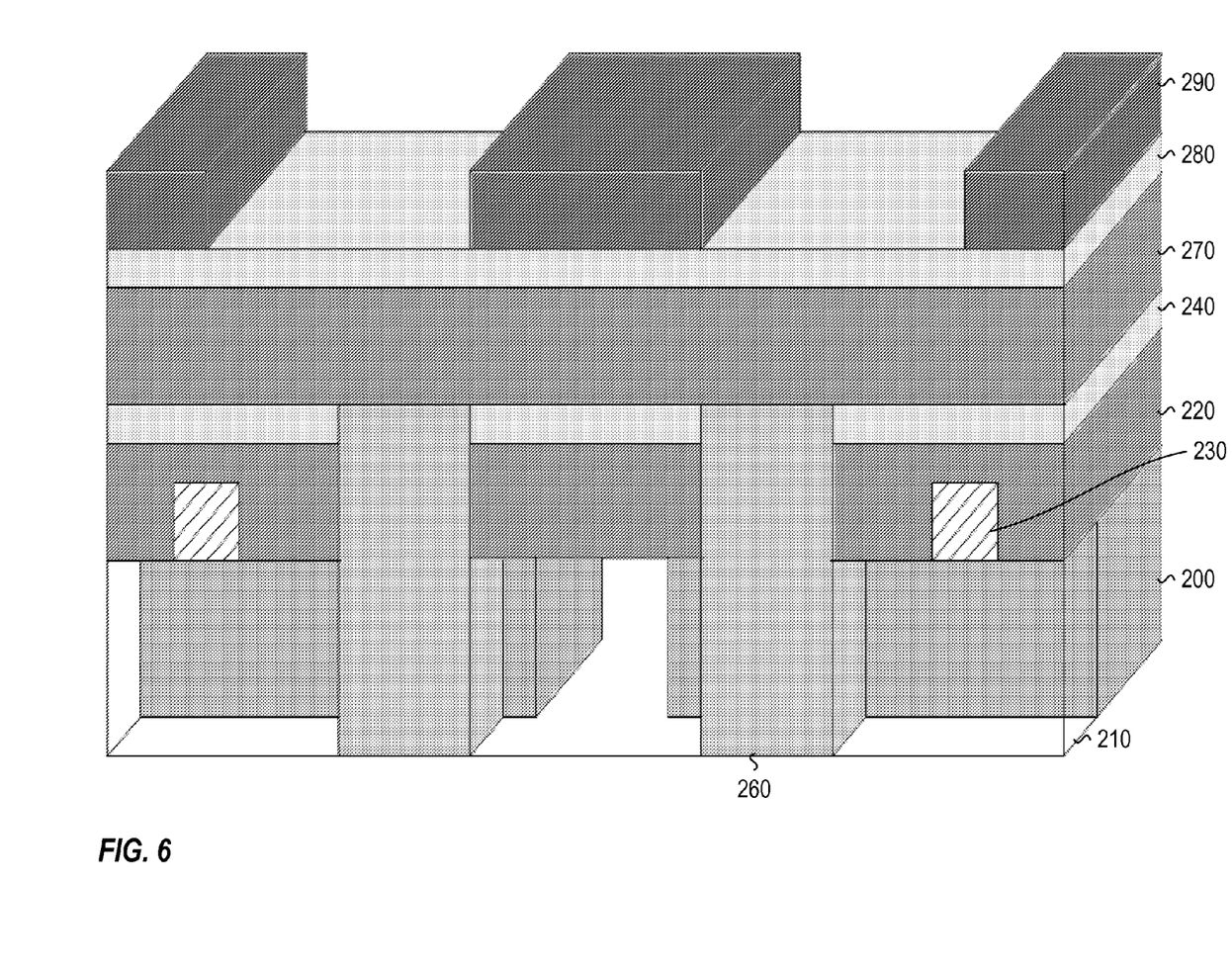
FIG. 6 illustrates the example substrate after the polymer is polished and formation of a third electrically insulating layer, a second nitride layer, and a second resist layer, according to one embodiment.

FIG. 6 illustrates the example substrate after the polymer 260 is polished so that it is only within the trenches 252, 254, a third electrically insulating layer 270 (e.g., ILD) is formed on top of the substrate (over the first nitride layer 240 and polymer 260), a second nitride layer 280 is formed on the third electrically insulating layer 270, and a second resist layer 290 is patterned over the second nitride layer 280. The second resist layer 290 is patterned to extend the capacitor trenches laterally along the semiconductor fins 200 toward the word-lines 230. The polishing of the polymer 260, the formation of the third electrically insulating layer 270 and the second nitride layer 280, and the patterning of the second resist layer 290 may be performed using any number of known techniques.

Figure 7:
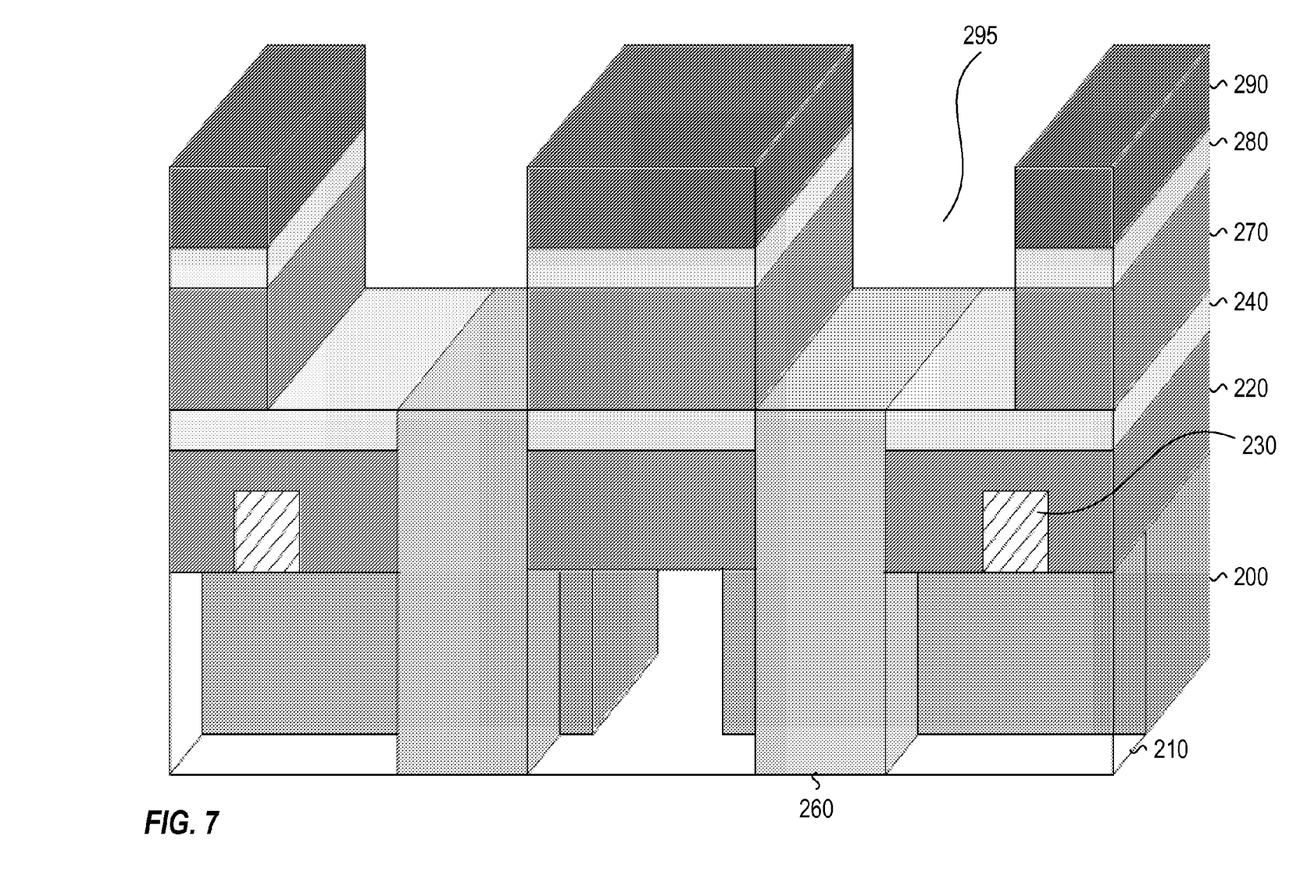
FIG. 7 illustrates the example substrate after the second nitride layer and the third electrically insulating layer are etched, according to one embodiment.

FIG. 7 illustrates the example substrate after the second nitride layer 280 and the third electrically insulating layer 270 are etched away to form capacitor extension trenches 295. The etching is performed using any number of known techniques.

Figure 8:
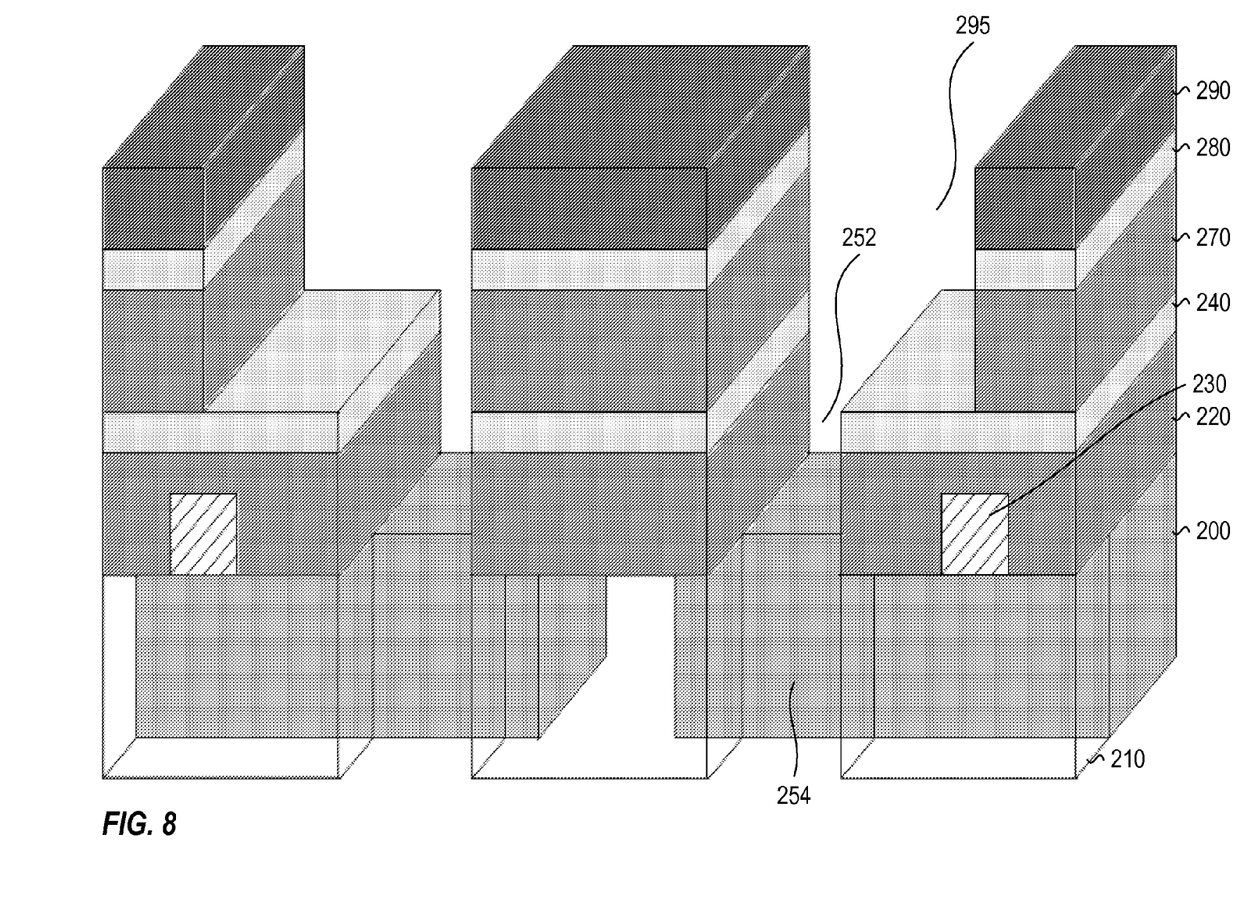
FIG. 8 illustrates the example substrate after the polymer layer is removed, according to one embodiment.

FIG. 8 illustrates the example substrate after the polymer layer 260 is removed, for example, with a plasma oxide ash process to reveal the capacitor body trenches 252 and the capacitor fin trenches 254.

Figure 9:
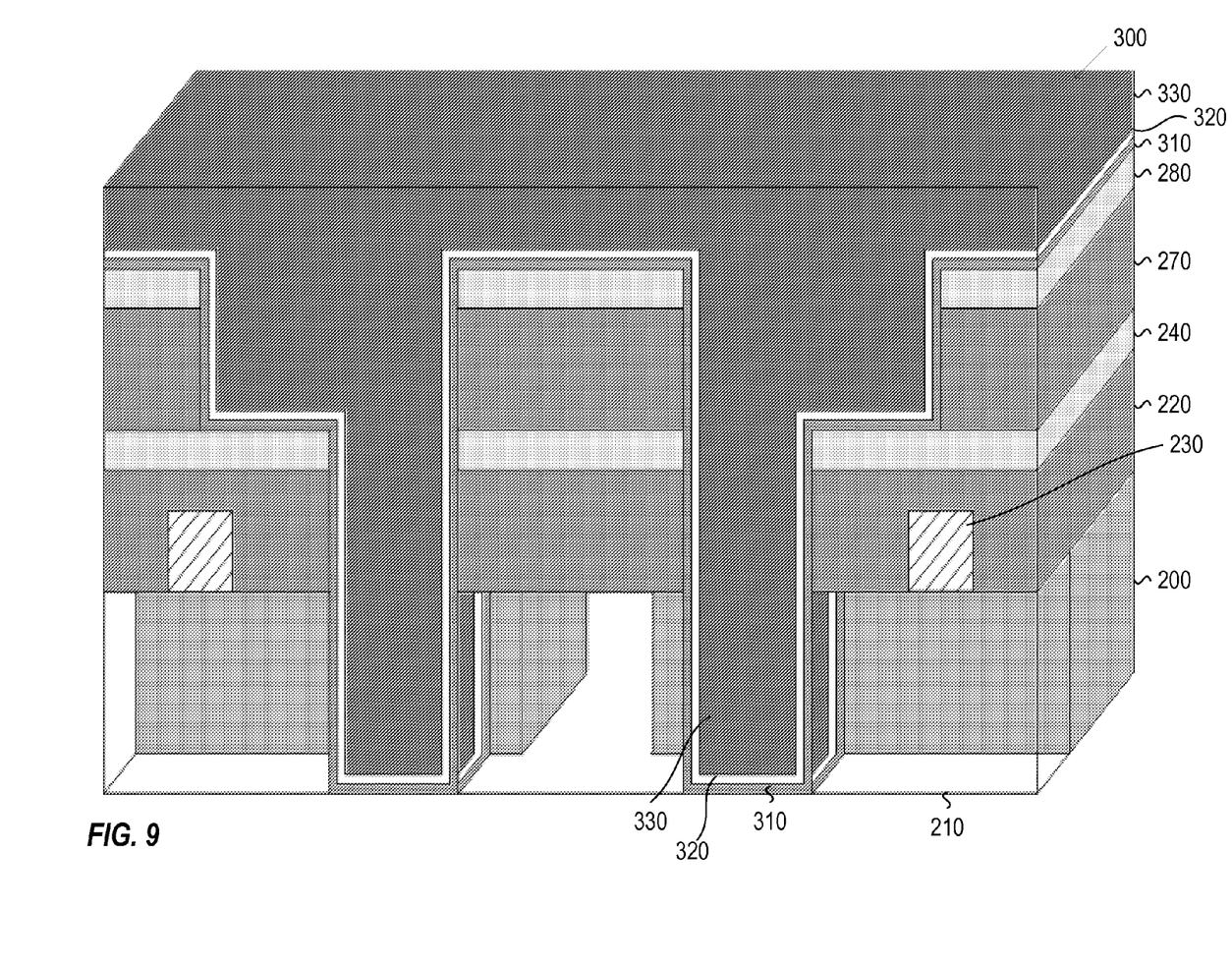
FIG. 9 illustrates the example substrate after a metal-insulator-metal (MIM) capacitor is formed, according to one embodiment.

FIG. 9 illustrates the example substrate after a metal-insulator-metal (MIM) capacitor 300 is formed. The MIM capacitor 300 may be formed by forming a thin electrically conducting layer 310 (e.g., metal) on the surface of the substrate (on the sidewalls of the trenches 252, 254, 295), forming a thin electrically insulating layer 320 (e.g., material with high dielectric constant) on the thin electrically conducting layer 310, and forming a thick electrically conducting layer over the substrate (fill in the trenches 252, 254, 295). The formation of the MIM capacitor 300 is performed using any number of known techniques.

Figure 10:
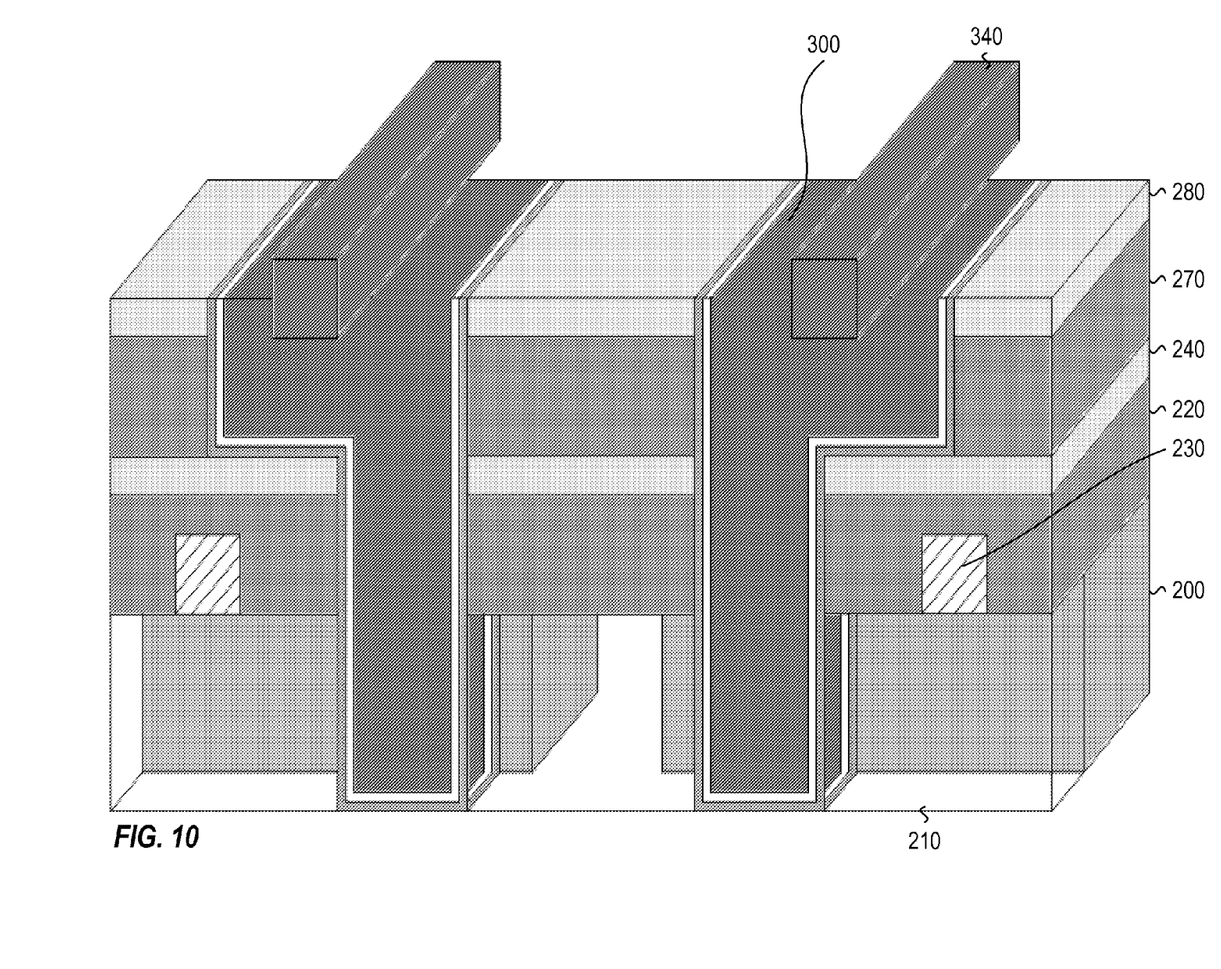
FIG. 10 illustrates the example substrate after the capacitor is etched back and plate lines are formed on the capacitor, according to one embodiment.

FIG. 10 illustrates the example substrate after the capacitor 300 is etched back so it is contained within the trenches 252, 254, 295 and plate lines 340 (e.g., metal) are formed on the capacitor 300.

The formation of the bit-line (e.g., 150 FIG. 1) is not illustrated in the process flow of FIGS. 2-10. The bit-line can be formed using any number of known techniques. For example, an isolation layer(s) may be formed over the substrate and then the bit-line (metal layer) can be formed thereon. The deposition of the isolation layer(s) and the metal layer can be performed using any number of known techniques.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. A method comprising:
   forming a semiconductor fin;
   forming a first insulating layer adjacent to the semiconductor fin;
   forming a second insulating layer over the first insulating layer and the semiconductor fin;
   forming a first trench in the second insulating layer and the first insulating layer therebelow;
   filing the first trench with a polymer;
   forming a third insulating layer over the polymer;
   forming a second trench in the third insulating layer, wherein the second trench is above the first trench and extends laterally therefrom;
   removing the polymer from the first trench; and
   forming a capacitor within the first and the second trenches.

2. The method of claim 1, further comprising forming a word-line above the semiconductor fin, wherein the word-line and the semiconductor fin create an access transistor.

3. The method of claim 2, wherein the access transistor is a planar transistor.

4. The method of claim 2, wherein the access transistor is a three-dimensional transistor.

5. The method of claim 2, wherein the forming a second insulating layer includes forming the second insulating layer over the word-line.

6. The method of claim 1, wherein the forming a first trench includes
   forming a hard mask layer over the second insulating layer;
   patterning the hard mask layer;
   etching the second insulating layer; and
   etching the first insulating layer.

7. The method of claim 6, wherein the forming a first trench further
   includes forming a nitride layer on the second insulating layer, wherein the forming a hard mask layer includes forming the hard mask layer on the nitride layer; and
   etching the nitride layer.

8. The method of claim 1, wherein the forming a second trench includes
   forming a nitride layer over the third insulating layer;
   forming a hard mask layer over the nitride layer;
   patterning the hard mask layer;
   etching the nitride layer; and
   etching the third insulating layer.

9. The method of claim 1, wherein the forming a capacitor includes forming a metal-insulator-metal (MIM) capacitor within the first and the second trenches.

10. The method of claim 1, wherein the forming a capacitor includes
    forming a thin conducting layer within the first and the second trenches;
    forming a thin isolation layer on the thin metal layer; and
    forming a thick conducting layer on the thin isolation area to fill in the first and the second trenches.

11. The method of claim 10, wherein the forming a thin isolation layer includes forming a high-k dielectric layer.

12. The method of claim 1, wherein the forming a first insulating, the forming a second insulating layer, and the forming a third insulating layer includes forming an inter-layer dielectric.

* * * * *